(12) United States Patent
Rebstock

(10) Patent No.: US 8,651,539 B1
(45) Date of Patent: *Feb. 18, 2014

(54) INTEGRATED GRIPPER FOR WORKPIECE TRANSFER

(71) Applicant: Lutz Rebstock, Gaienhofen (DE)

(72) Inventor: Lutz Rebstock, Gaienhofen (DE)

(73) Assignees: Dynamic Micro System, Radolfzell (DE); Semiconductor Equipment GmbH, Radolfzell (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/740,257

(22) Filed: Jan. 13, 2013

Related U.S. Application Data

(63) Continuation of application No. 11/881,088, filed on Jul. 25, 2007, now Pat. No. 8,376,428.

(51) Int. Cl.
*B65H 1/00* (2006.01)
*G06F 19/00* (2011.01)

(52) U.S. Cl.
USPC .......... 294/2; 294/213; 294/901; 414/225.01; 414/941; 901/31

(58) Field of Classification Search
USPC .............. 294/2, 6, 29, 31.1, 27.1, 213, 119.1, 294/902, 907; 414/941, 217, 225.01, 414/416.08, 744.5, 744.8; 901/15, 30, 31; 700/245, 250; 134/140
See application file for complete search history.

(56) References Cited

U.S. PATENT DOCUMENTS

| 3,968,885 | A | 7/1976 | Hassan et al. |
| 4,410,209 | A | 10/1983 | Trapani |
| 4,452,480 | A | 6/1984 | Maier et al. |
| 4,778,332 | A | 10/1988 | Byers et al. |
| 4,848,814 | A | 7/1989 | Suzuki et al. |
| 5,192,106 | A | 3/1993 | Kaufman |
| 5,700,046 | A | 12/1997 | Van Doren et al. |
| 6,077,026 | A | 6/2000 | Shultz |
| 6,164,899 | A | 12/2000 | Burg et al. |
| 6,368,040 | B1 | 4/2002 | Yamasaki et al. |
| 6,499,936 | B2 | 12/2002 | Ishigame |
| 6,592,324 | B2 | 7/2003 | Downs et al. |
| 6,909,276 | B2 | 6/2005 | Hofer et al. |
| 6,991,419 | B2 | 1/2006 | Kim |
| D552,138 | S | 10/2007 | Kondo et al. |
| 7,396,199 | B2 | 7/2008 | Koyama et al. |
| 7,401,828 | B2 | 7/2008 | Yang |
| 7,616,289 | B2 | 11/2009 | Chae et al. |
| 7,751,172 | B2 | 7/2010 | Purohit et al. |
| 7,896,602 | B2 | 3/2011 | Rebstock |
| 7,900,776 | B2 | 3/2011 | Burns et al. |
| 8,376,428 | B2 * | 2/2013 | Rebstock ............ 294/2 |
| 2001/0011876 | A1 | 8/2001 | Saino |
| 2002/0048506 | A1 | 4/2002 | Babbs et al. |

OTHER PUBLICATIONS

PCT preliminary report on patentability—PCTIB2007/054654—dated May 28, 2009.

* cited by examiner

*Primary Examiner* — Paul T Chin
(74) *Attorney, Agent, or Firm* — Tue Nguyen

(57) ABSTRACT

An integrated grip arm for transfer reticles and carrier boxes is disclosed for improving throughput, yield and reliability of transport equipment. The integrated grip arm comprises a plurality of grippers to accommodate a plurality of reticles and carrier boxes without the need of separate arm or gripper changes. The integrated grip arm can further comprise sensor or means to select the right gripper for the right reticles or carrier boxes.

18 Claims, 9 Drawing Sheets

Toppan Box
reachable with edge and fork gripper

INTEGRATED GRIPPER FOR WORKPIECE TRANSFER

This application claims priority from U.S. provisional patent application Ser. No. 11/881,088, filed on Jul. 25, 2007, entitled "Integrated gripper for workpiece transfer"; which is incorporated herein by reference.

FIELD OF THE INVENTION

The present invention relates to apparatuses and methods to transfer objects, and more particularly to an integrated grip arm for moving workpieces, such as semiconductor wafers, reticles or carrier boxes.

BACKGROUND

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport workpieces, typically stored in carrier boxes, from one location to another location, from one equipment to another equipment. In a process system, a robot is typically used to remove the workpieces from the carrier boxes, and then loaded into a loadlock. Another robot can be used to move the workpiece from the loadlock into a processing chamber, and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any workpiece processing system.

Another type of equipment is supplemental equipment such as a stocker, designed for storing the workpieces until needed, or a sorter, designed for sorting the workpieces into certain desirable order. In a typical bare stocker system, a robot is typically used to remove the workpieces from the carrier boxes, and then loaded into a loadlock. Another robot can be used to move the workpiece from the loadlock into a storage chamber, where the workpieces are stored without the original carrier boxes. For box stocker system, the workpieces are stored together with the carrier boxes, without the need for removing them out of the carrier boxes.

There are different robot arms for handling different workpieces. For example, semiconductor wafers can be handled from the backside, thus a typical robot arm has an end effector to support the wafer. The wafer usually rests on the end effector, held by either gravity of vacuum suction. For reticles, backside handling is not advisable since it might cause damage. Thus grippers are typically used to handle reticles at the edge.

To improve the efficiency of the fabrication facility and to improve the throughput of the equipment, robots with dual end effectors have been employed to transfer semiconductor wafers. Typically, the two ends of the dual end effector are similar, allowing the transfer of two identical wafers.

With the advancement of semiconductor processing, increasing emphasis is being placed on reticles. Critical defects on reticles are now in the same order of magnitude as defects on wafer, because even reticles have a higher tolerance for critical dimension as compared to semiconductor wafer, their affected area is much larger.

Reticles and reticle carrier boxes has few standards, especially for automation handling, perhaps because of the variety of reticle sizes used in the fabrication facility. And partly because of this lack of standards, many designs for reticles, containers, and boxes are in use in the facility. Reticle handling thus includes special fixtures or cassettes, and typically requires different reticle end-effector and clearances, resulting in multiple, custom end-effector, grippers and automation designs.

One reticle handling mechanism includes switchable arms with a docking station to store various kinds of grippers. Changing arm could reduce throughput, generate particle and reduce yield and reliability of robot arms.

SUMMARY

An integrated grip arm for transfer reticles and carrier boxes is disclosed for improving throughput, yield and reliability of transport equipment. In an embodiment, the integrated grip arm comprises a plurality of grippers to accommodate a plurality of wafers, reticles and carrier boxes. The exemplary integrated grip arm comprises at least two gripper arm segments serving two distinct functions of workpiece movement.

In an embodiment, the integrated grip arm is configured for servicing a reticle equipment, such as a reticle stocker, comprising an edge gripper and a fork gripper. The edge gripper is designed to be an integrated part of the grip arm, configured for gripping the reticle from the side edges. The fork gripper is configured for gripping the reticle from the top or bottom, preferably closer to the edge of the reticle.

The integrated grip arm also can comprise a carrier gripper, configured for gripping a container box that stores the reticle. The integrated grip arm thus can accommodate both the reticle and its container without the need for separate arms or for gripper change. In one aspect, the container box is a carrier box, configured for transporting the reticle within the fabrication facility, from one tool to another. In other aspect, the container box is a storage box, configured for protecting the reticle within the stocker.

In an embodiment, the integrated grip arm is configured for servicing a wafer equipment, such as a wafer stocker, comprising an edge gripper and an end effector. The edge gripper is configured for gripping the wafer from the side edges. The end effector is configured for holding the wafer from the bottom, either by gravity or by gripping action.

In an embodiment, the integrated grip arm comprises a robot with multiple articulate joints and segments. The robot can be a cartesian robot, a r, theta and z robot, or a 6-axis robot. The plurality of gripper arm segments can be rigidly attached to each other, rigidly attached to an segment of the integrated grip arm, or can be freely rotated for the selection of arm segments.

In an embodiment, the integrated grip arm comprises a sensor, or a controller for the selection of gripper arm segments. A sensor can indicate the locations of certain reticles, wafers or containers for the integrated grip arm to select the proper gripper arm segment. A controller can contain predetermined locations of certain reticles, wafers or containers and can communicate with the integrated grip arm to select the proper gripper arm segment. The controller can further communicate of the integrated grip arm about when and where to use which gripper arm segments.

In a preferred embodiment, the integrated grip arm according to the present invention can be used in semiconductor

DETAILED DESCRIPTION OF THE EMBODIMENTS

The present invention discloses an integrated grip arm for transfer the workpieces in a fabrication facility. In an exemplary embodiment, the integrated grip arm can provide throughput, yield and reliability improvement of transport equipment. The integrated grip arm according to an embodiment of the present invention comprises a plurality of grippers to accommodate a plurality of wafers, reticles, carrier boxes and other workpieces without the need of separate arm or gripper changes.

In an embodiment, the integrated grip arm is configured to service a system utilizing reticles such as a reticle stocker. Semiconductor fabrication facility uses non-standardized reticles and reticle containers, thus different reticle handlers exist for different designs of reticles or containers. Thus for an equipment, such as a reticle stocker, to handle a plurality of reticle designs, it requires multiple and custom reticle end-effectors and grippers with different clearances.

When transferring a reticle, minimum contact with the upper and lower surfaces of the reticle is desirable since any such contact may generate particles or affect the reticle. Thus the engagement between the reticle and gripping mechanism is minimal and precisely controlled. The gripping mechanism is typically an edge gripping or a fork gripping mechanism.

Figure 1:
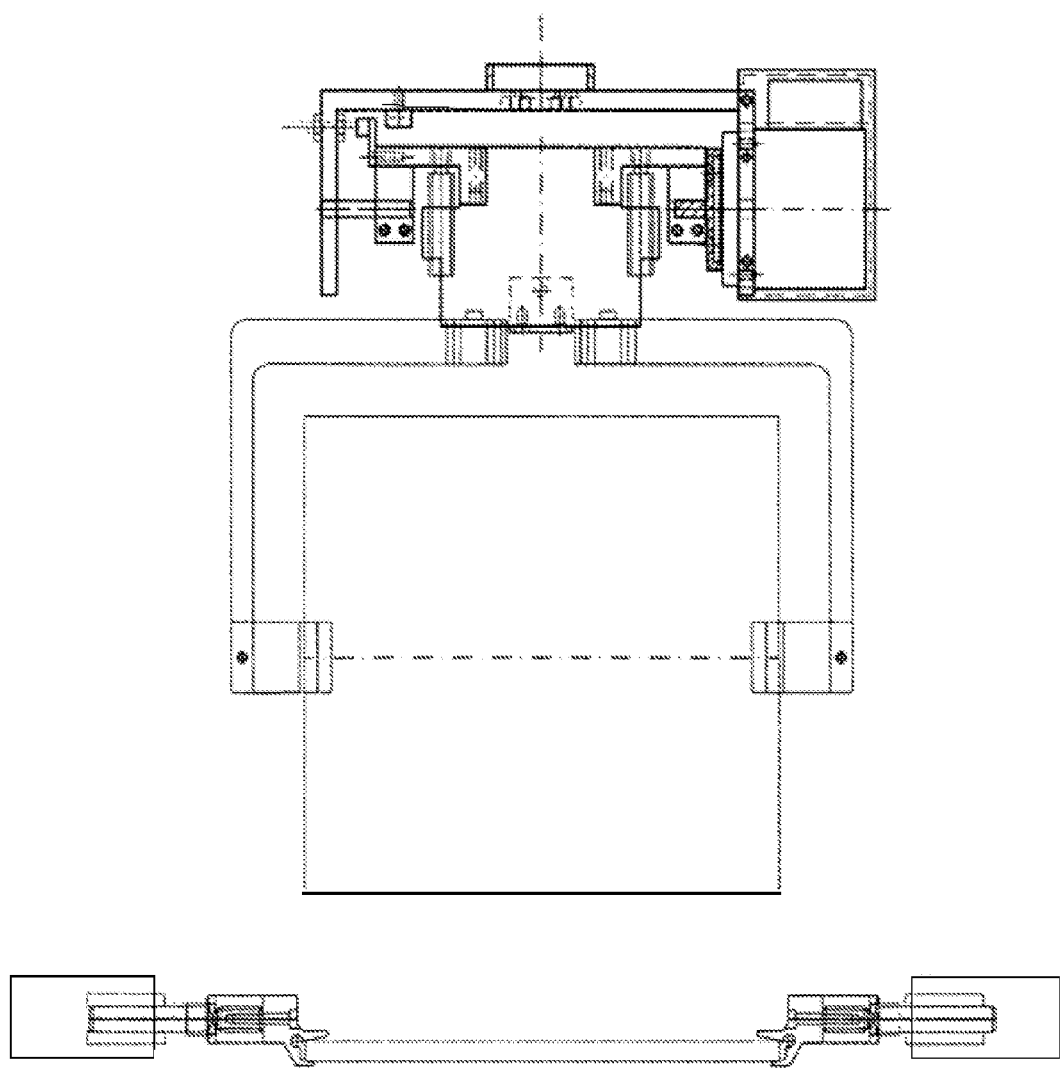
FIG. 1 shows an exemplary grip arm segment of edge gripper.

Reticle handling typically includes an edge gripper segment where the grip arm has a plurality of grippers 101A and 101B to grip the reticle at the edge 102, usually at the side edge of the reticle 100. The edge gripping mechanism 104 includes at least two V shape arms 106A and 106B, approaching the reticle from the left and right sides 102 to hold the reticle. The edge gripper typically includes two V shape grippers at each side of the reticle. The gripping mechanism can include two or four extending V shaped posts spaced apart from each other to contact the outer rim of the reticle. The gripping mechanism 104 can move the posts 101A and 101B together to grip and transfer the reticle. Each of the V-shaped posts 101A and 101B can provide an angled chamfer to engage the edge of the reticle. FIG. 1 shows an exemplary edge gripper segment, holding a reticle 100 at the side edges 102. The edge gripper comprises a left 101A and a right 101B gripper, each having a finite length. The grippers have U-groove shape 103 for minimize the contact with the reticle. The edge gripper can move laterally to capture or release the reticle.

Figure 2:
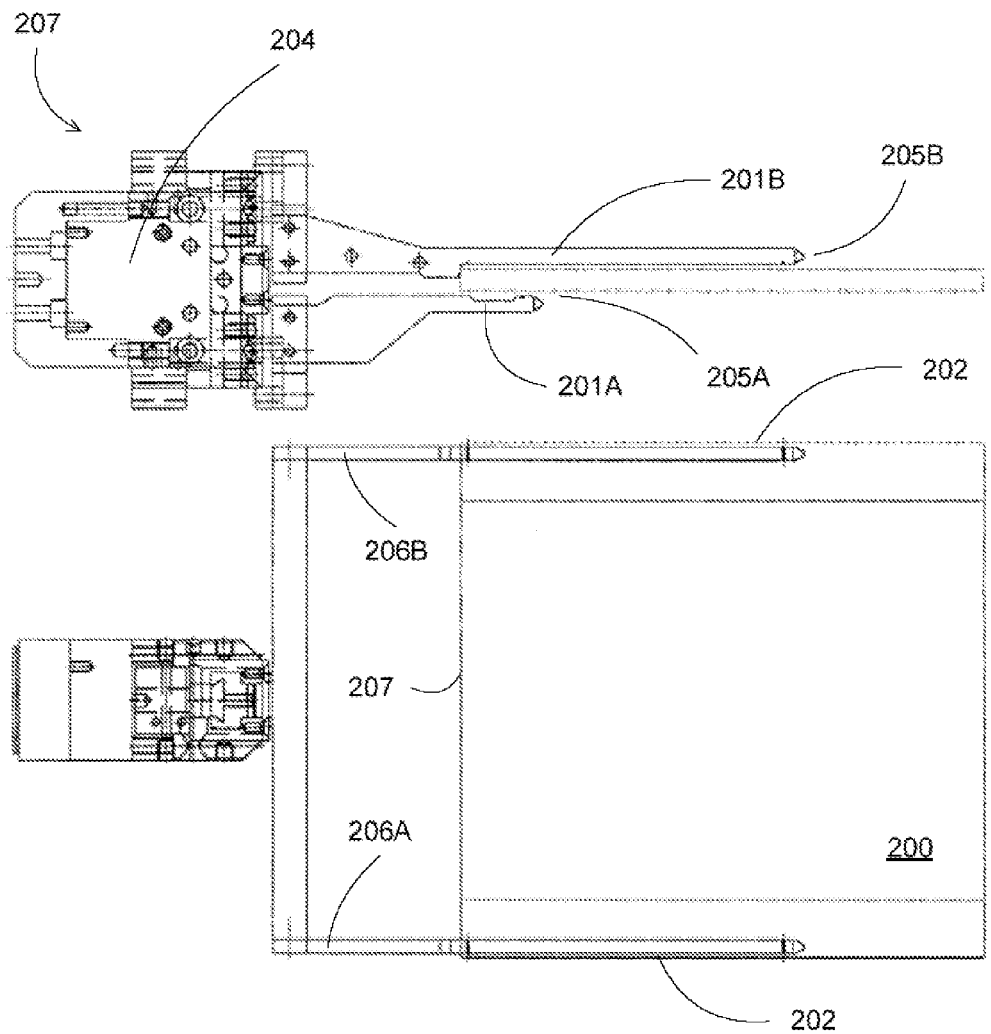
FIG. 2 shows an exemplary grip arm segment of fork gripper.

Other reticle handling is fork gripper where the grip arm 204 has a plurality of grippers 201A and 201B to hold the reticle 200 at the bottom 205A, and optional at the top 205B, usually at a place close to the edge 202 of the reticle. The fork gripper mechanism includes two forks 206A and 206B, positioned near the edge 202 of the reticle 200 to hold the reticle in place. The fork gripper mechanism allows each gripper to engage and grip the reticle across substantially the edge of reticle. FIG. 2 shows an exemplary fork gripper 207, holding a reticle 200 at two edges 202. The fork gripper comprises a fork 206A or 206B with a top section 201B and a bottom section 201A for capturing the reticle 200. In an exemplary transfer motion of a fork gripper reticle, the integrated grip arm inserts the fork gripper horizontally beneath the reticle until the grooved front fork grippers are positioned to receive an edge 207 of the reticle. Then the gripper is raised to move the reticle out of the container.

Figure 3:
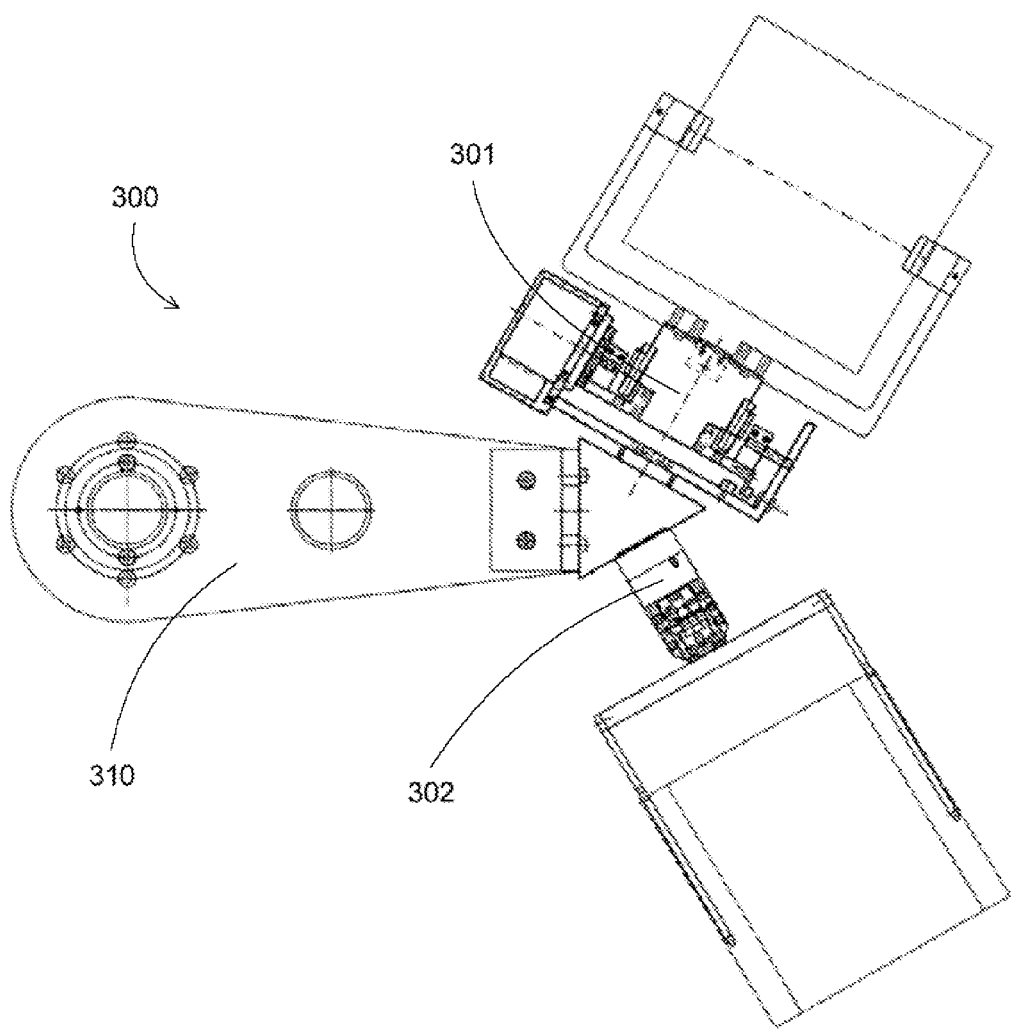
FIG. 3 shows an exemplary embodiment of the present invention integrated grip arm comprising an edge gripper and a fork gripper.

There are various designs of container and reticles, and therefore the requiring different automation equipment to handle different reticle design. The present invention provides an integrated grip arm with a plurality of grippers to accommodate different designs of reticles and containers. The various reticle designs are particularly employed in a stocker, where different reticles and carrier boxes are stored. The grip arm of the present invention is designed to interface with a plurality of reticles or carrier boxes with the use of a plurality of grippers. An exemplary embodiment of the present invention integrated grip arm 300 is shown in FIG. 3, comprising two gripper arms, an edge gripper 301 and a fork gripper 302. Other configurations such as two edge grippers or two fork grippers are also possible.

The grippers can also in the form of multiple different reticle gripping tools, fixedly or rotatingly mounted on the robot arm. The grippers can also be in the form of carrier box gripping tools. In an exemplary configuration, the multiple grippers are mounted on an arm segment 310, or an end effector of the robot arm. Further, for fork gripper, a fork gripper mechanism can use gravity to secure the reticle. The fork gripper can be static dissipative and has slender fork which are configured for insertion into slots to retrieve the reticle. In another embodiment, gripper includes mechanical grippers which are activated to grip the reticles. Also, the gripper can grip the reticles mechanically and can hold the reticles with a traylike configuration with a recess for capturing the reticles. The gripper can also have a locking part and a gripping part. The gripper can contact the reticles at limited areas, such as on reticle edges, near the reticle edge, or on the chamfered edge, thus the grip arm provides minimum particle generation to protect pattern geometry of the reticles, and minimizes operator interaction to prevent reticle mishandling, and damage, plus including process control to prevent the mishandling of reticles. The grip arm also avoids contact with vertical edges of the reticle.

The grippers can engage the reticle with the reticle properly positioned within the gripper. For releasing, the grippers are retracted from their engagement with the reticle. In an embodiment, the gripper mechanism can include spring-loaded mechanisms to secure or to release the reticles. The gripper mechanism can include magnetic components, to release reticles by overpowering the magnetic attraction, or to temporarily energize to overcome the magnetic attraction.

The reticle transfer system according to an embodiment of the present invention includes an arm assembly having a transfer arm 310 capable of rotation and translation, and a plurality of gripping mechanisms affixed to the end of the transfer arm 310. Once the reticle has been exposed from the container, a proper gripping mechanism is selected, with rotation and translation, so that it may access the reticle and transfer it from the container. The present invention provides a reticle transfer system that automatic transfer a reticle, regardless of the reticle types, by the use of corresponding reticle grippers.

In an exemplary operation of the integrated grip arm, the I/O station opens the box, the gripper moves in with the left and right arm moving synchronized together and clamping on the reticle. The edge gripper clamps at the right and left side in the middle of the reticle. The fork gripper comes from the front and moves two upper and two lower arms synchronized together to clamp the reticle from top and downside. The advantage of moving the arms synchronized together is that the reticle can be centered.

Figure 4:
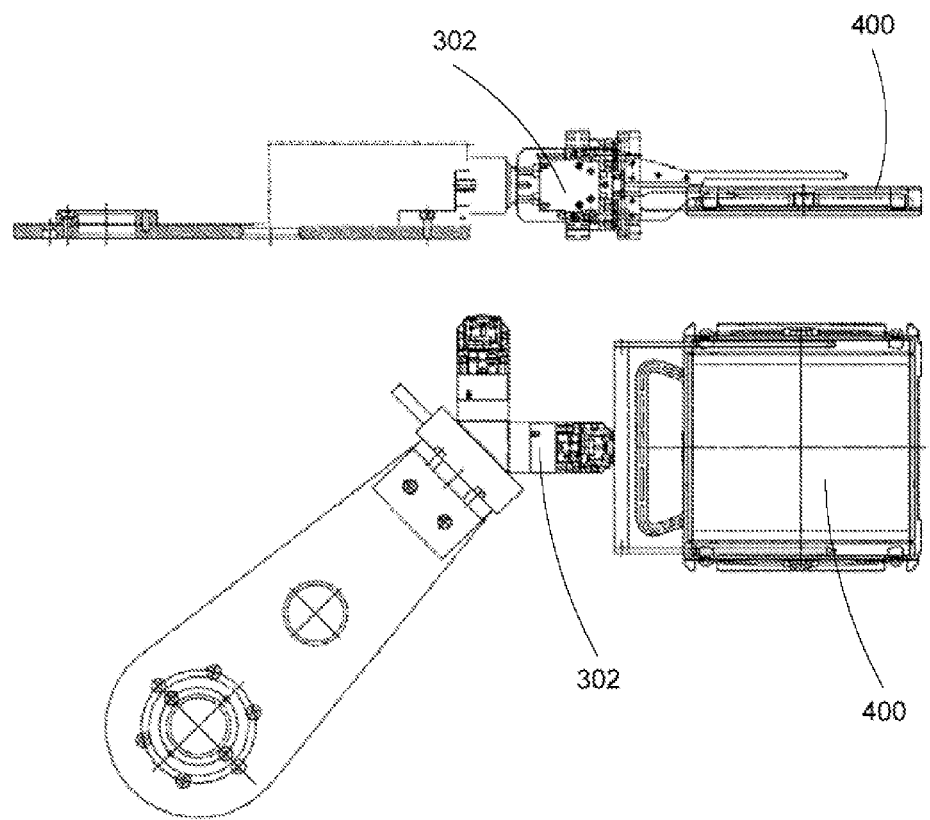
FIG. 4 shows an exemplary reticle container, reachable with a fork gripper.
Figure 5:
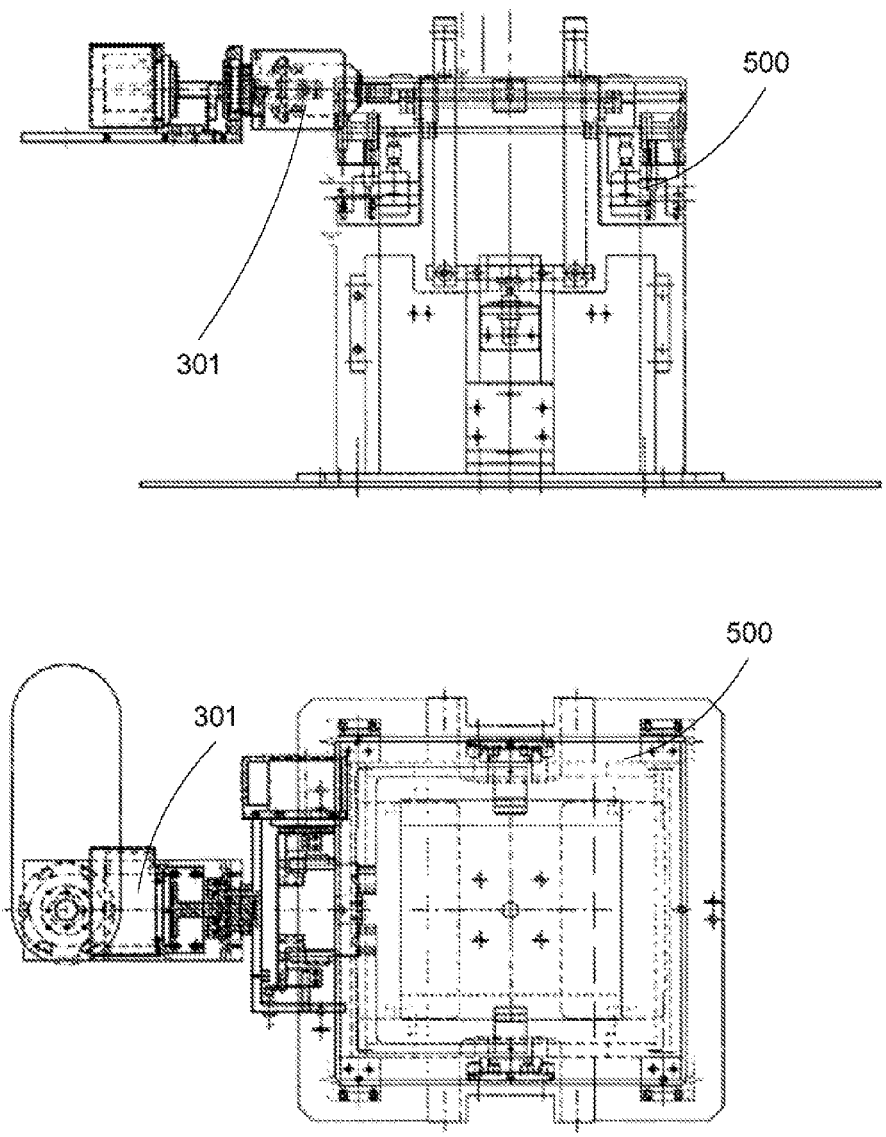
FIG. 5 shows an exemplary reticle container, reachable with an edge gripper.
Figure 6:
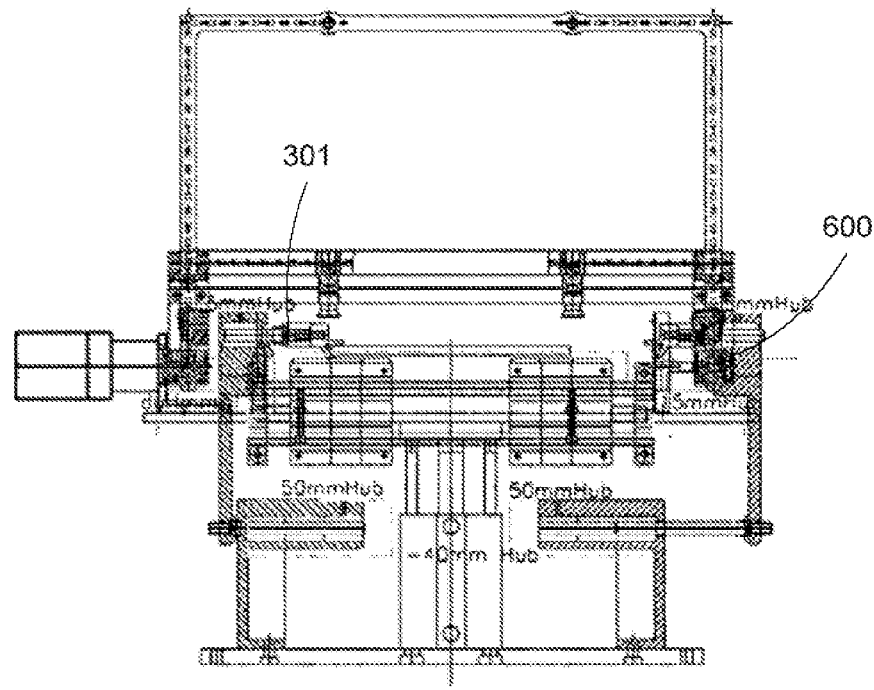
FIG. 6 shows an exemplary reticle container, reachable with either a fork gripper or an edge gripper.
Figure 6:
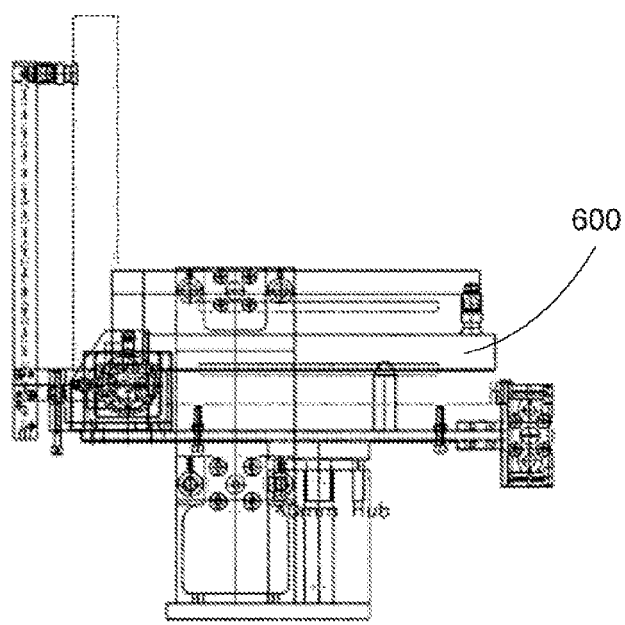
Figure 7:
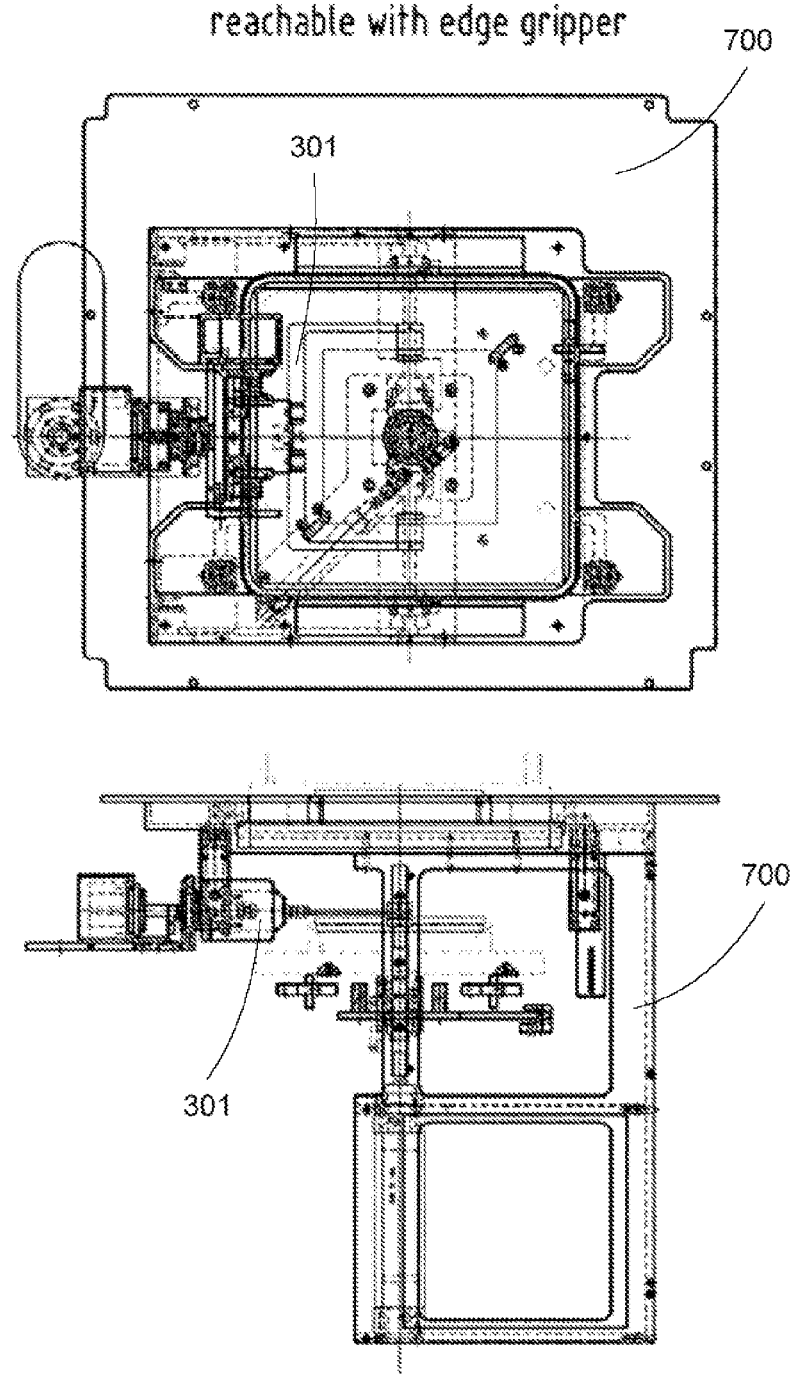
FIG. 7 shows another exemplary reticle container, reachable with an edge gripper.
Figure 8:
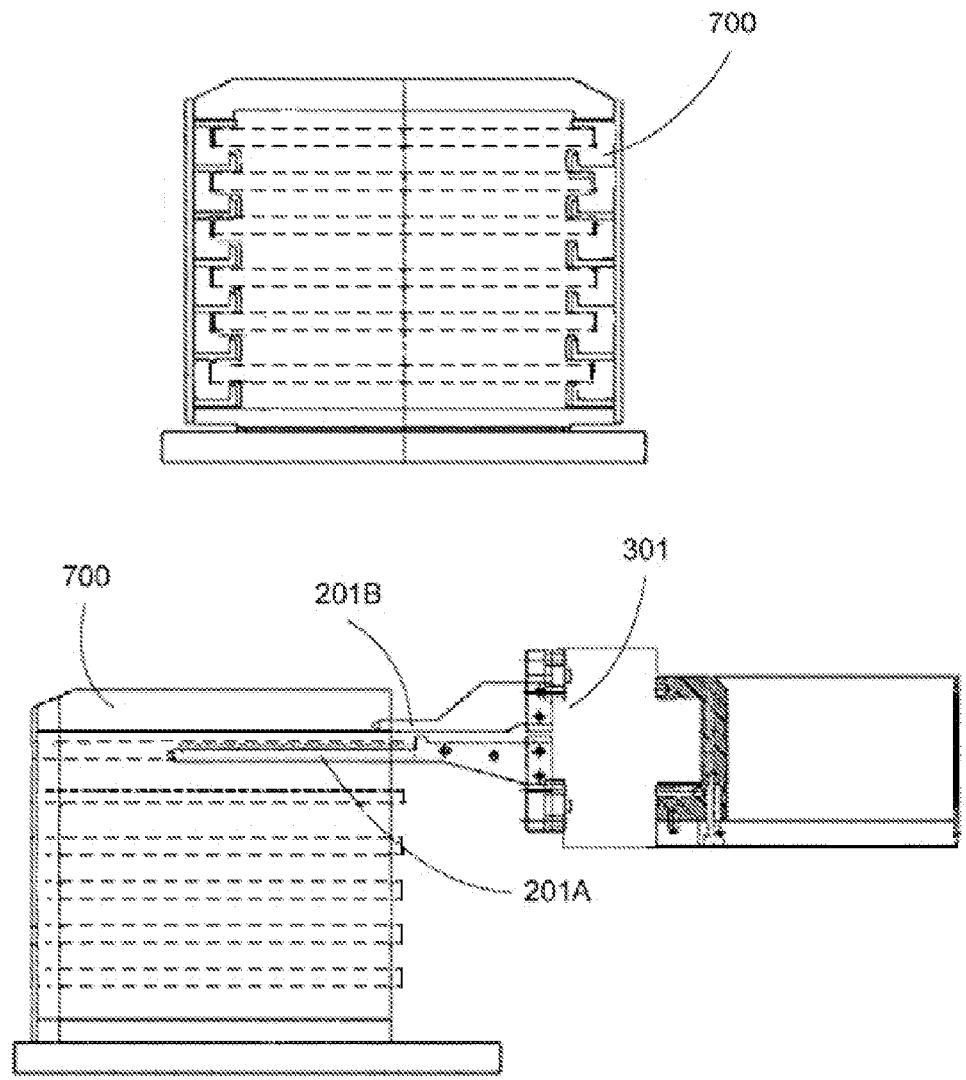
FIG. 8 shows an exemplary multiple reticle container, reachable with a fork gripper.

FIGS. 4-8 show various designs of reticles and reticle carrier box. The different designs allow either an edge gripper, a fork gripper, or a combination of both. The carrier box can also accommodate one reticle or a plurality of reticles. FIG. 4 shows a Canon Box 400 reachable with fork gripper 302. FIG. 5 shows an Initial Box 500 only reachable with edge gripper 301. FIG. 6 shows a Toppan Box 600 reachable with edge 310 and fork gripper. FIG. 7 shows an RSP 200 Box 700 reachable with edge gripper 301. FIG. 8 shows a SMIF Box 800 reachable with fork gripper 302.

The integrated grip arms according to the present invention can eliminate or minimize various problems related with exchanging grippers, such as alignment problem, particle generation problem, gripper storage problem, and throughput and yield problem. Further, the system footprint can be reduced by the use of integrated grippers, eliminating the need for gripper storage. The integrated grip arm is preferably designed so that one gripper does not interfere with other gripper, especially during pickup or placing operations. For example, the grippers can grip the workpieces at different planes, or the grippers are separated by a large angle (preferably 70 to 170 degrees). The grippers can move (rotating, linear, or swiveling) independently with respect to each other. The arm segment holding the grippers can also movable (rotating, linear, or swiveling) to help moving one gripper out of the way of the other gripper.

In an embodiment, a robot having an integrated grip arm is provided in a stocker, interfacing a storage area with a loadlock area. The robot serves to load and unload the various reticles into the storage area using different grippers for different reticles. The different grippers are designed to be rigidly or rotationally attached to the robot arm, with any desired electrical, pneumatic or mechanical connections between the associated components and the robot arm. The robot can have two or more degrees of freedom, such as a Z axis motion and yaw and roll motion of the robot arm. Moreover, the robot may include additional degrees of freedom such as tilting with respect to the Z-axis, axial rotation, or roll, of segments of the arm, thus provide a robot arm with six degrees of freedom. A number of conventional drive motors, such as a stepper or brushless motor, drive the robot arm assembly. The gripping mechanisms are mounted to a distal end of the arm assemble so that the arm and gripping mechanisms may move separately and simultaneously. The controller controls the movement, rotation and translation, of the robot arm and gripping mechanisms so that one gripping mechanism is properly positioned to grip and transfer the correct reticle. The multiple functions of the robot arm, which is provided with different grippers, provide the capability to handle different reticle designs in an efficient manner.

In another embodiment, the integrated grip arm is configured for gripping a container box, such as a carrier box or a storage box. Reticles are conventionally handled in protective containers, such as carrier boxes or storage boxes. The handling of the reticles is typically performed in a clean environment when and where the reticles are transferred from the protective containers.

Typically, a container includes a plurality of reticles stacked inside the container. When ready for processing or storage, the container is docked with an interface door of a clean environment. The interface door is normally closed to isolate the clean environment conditions, and can be opened after the container is in the docked position. The interface door also can open the container to permit transport of the reticles inside the container to the clean environment.

The integrated grip arm can load and unload e.g. five or more different boxes of reticles. The opening stations (I/O stations) are used to handle the reticle with the gripper. The gripper allows the loading and unloading all I/O stations, the buffer and rotation station. Furthermore the reticle can be rotates and flipped (2 degrees of freedom) in an inspection station with the gripper.

The stocker can include a station for incorporate a storage container to the bare reticle. The robot then provides the function of transfer the reticles from the loadlock to the station, and to transfer the reticle with storage container to the storage area. The different grippers can serve to move the reticles, and serve to move the storage boxes. In an exemplary embodiment, the I/O station is loaded with a carrier box containing a plurality of reticles. The box opens, preferably in an interface station for contamination isolation, and the first gripper picks the reticle from the box and places it in a protective or storage box, e.g. a semi bare box. Afterwards the gripper is switched, the semi bare box will be picked and placed in the stocker. The robot can bear, theta, z robot, or a 6 axis robot. Reticles can also be transferred within SMIF pods, which include a pod door which interfaces with a docking station to provide a sealed environment in which the reticles may be transferred.

In an embodiment, the integrated grip arm is configured to service a system utilizing wafers such as a wafer stocker. Semiconductor fabrication equipment uses robots having end effectors to handle wafers from the bottom. However, wafer stocker can store the wafers in various positions, with very close pitch for high density storage with low footprint. Thus different wafer handlers exist for different designs of wafer stockers and its interfaces.

In an exemplary embodiment, the gripper of the integrated grip arm can be adjustable between a horizontal and a vertical position. Thus the gripper can move a vertically stored wafer article into a horizontal position and vice versa. This is particularly advantageous since conventional storage systems, e.g. wafer containers, FOUPs, buffer station, etc., are storing wafers in the horizontal positions. Storing wafers in the vertical position can be arranged for higher density.

A first gripper comprises at least two grip elements, spanning a circular arc of more than 180°. Preferably the gripper picks up the wafers only at its edges. The gripper surround the wafer to more than half of the circle, thus can hold the wafer essentially due to the force of gravity, e.g. the gripper does not need a strong clamping mechanism to grip the wafer. This reduces the possible damage to the wafer.

A second gripper comprises an end effector for picking wafers in horizontal positions. The second gripper is designed for transfer a wafer horizontally in and out of a FOUP. The integrated grip arm can comprise a handling unit with at least two free ends, at which a first and a second grippers are arranged. The handling unit is preferably about L-shaped, e.g. forming an angle between 70 to 10 degrees, with the first gripper swiveling around an axis of rotation, parallel and preferably coaxially to a leg of the L-shaped handling unit. This arrangement is economic and space-saving, with the two grippers operated with few actuators.

Figure 9:
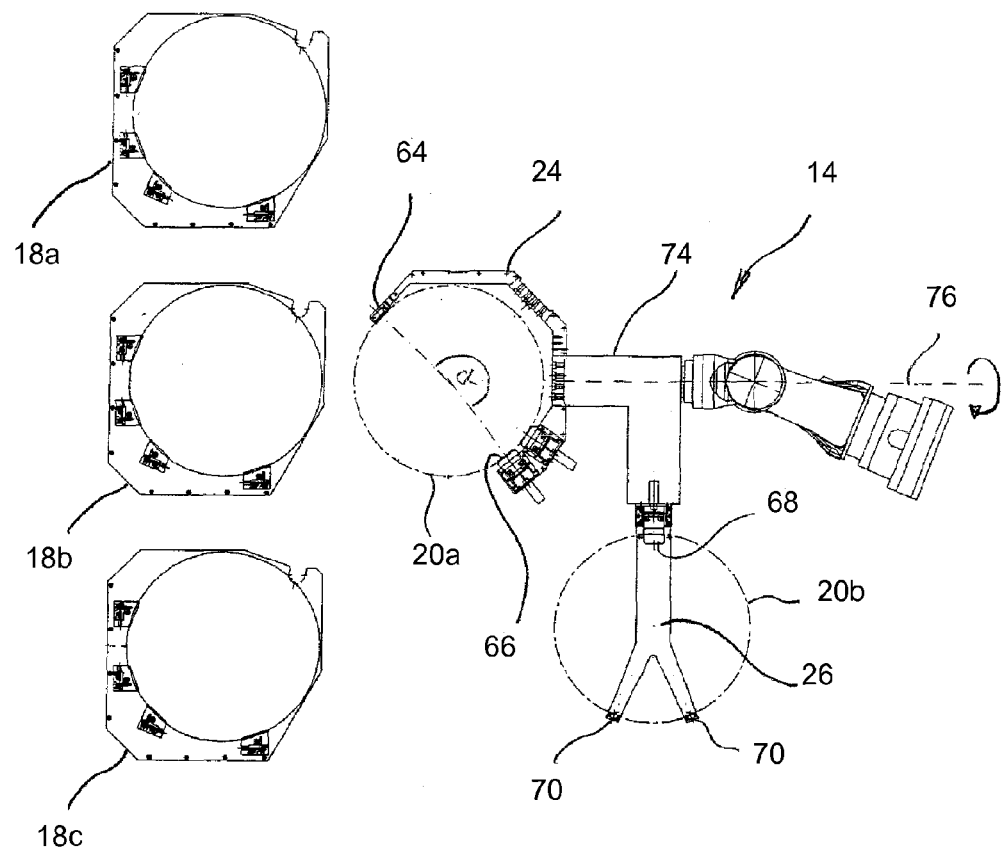
FIG. 9 shows an exemplary system according to the present invention.
Figure 9:
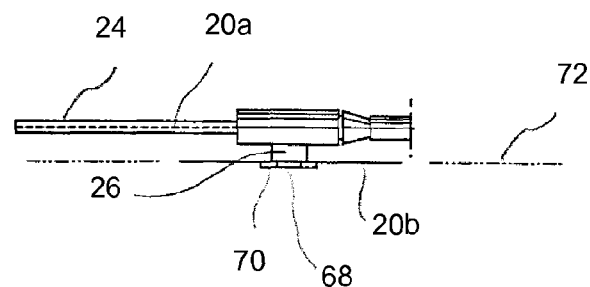

FIG. 9 shows an exemplary system according to the present invention. The integrated grip arm 14 possesses a first gripper arm 24 and a second gripper arm 26. The first gripper arm 24 is designed as a grip arm, where a wafer 20a can be seized at the edges in a vertical position. The grip arm 24 surrounds the wafer 20a at its outer circumference in an exemplary C-shaped. Two grip elements 64 and 66 are arranged at the free ends of the grip arm 24. The grip arm 24 surrounds the wafer 20a along a circular arc "alpha" of more than 180°. The grip elements 64, 66 can hold the wafer 20a therefore without firm wedging and essentially alone due to gravity. For the pick up and placement of a wafer 20a in a carrier box 18, the grip elements 64, 66 can be opened. In this figure, only the grip element 66 is mobile.

The second gripper arm 26 comprises a Y-shape arm with grip elements 68, 70 at the ends. The gripper arm 26 is holding a wafer in different plane 72 than the gripper arm 24. A wafer 20b is held by the grip elements 68, 70 in the plane 72. The gripper arm 26 has a free end, thus can enter a FOUP to pick up or placing a wafer.

The grippers 24 and 26 are arranged at the free ends of an L-shaped arm segment 74 of an integrated grip arm 14. The arm segment 74 can be swiveling around an axle 76, which lies coaxially to a leg of the arm segment 74, where the gripper 24 is located. This arrangement makes it possible to take and by a 90° rotation around the axle 76, bringing a wafer 20a into a horizontal position out of a vertical position from the carrier box 18. The integrated grip arm can then transfer the wafer to a horizontal station. The integrated grip arm then switches gripper, and the gripper 26 can pick up the wafer and transfer to a FOUP. Wafers from the FOUP can be brought into the carrier box 18 by reverse operations. The integrated grip arm thus can provide movement of the wafers from a FOUP to the storage area with the grippers 24 and 26.

In an embodiment, the integrated grip arm comprises a means for selecting the proper gripper. The means can be a sensor or a controller, implemented to assist in the selection of gripper. The sensor can be selection sensor, telling the grip arm to move the position so that the proper gripper is presented to the correct position to pickup or placing the workpieces. The sensor can be mated sensor pair, one in the workpiece location and one in the gripper location. When the proper gripper is presented, the sensor pair agrees, and the grip arm proceeds. The sensor pair could be ON/OFF sensor with different designs of workpieces located at different locations. Thus only matched gripper/workpiece can generate a ON signal. The sensor is preferably wireless, such as RF, or IR sensors. Short range RFID sensor can also be used.

In general the robot handle one gripper for one workpiece, thus the selection of grippers is determined by looking at the boxes and the buffer, by using sensors, or by using controller for predetermined location. In an alternative embodiment in accordance with the invention, the robot arm may be designed to accommodate a sensor to identify different reticle designs, so that the robot arm can select properly the right gripper. For the selection of gripper mechanisms, sensors can indicate the type of reticle, and thus the proper gripper mechanism.

The selection means can be implemented with a controller. The locations of various designs of workpieces can be pre-programmed, and thus the grip arm, when asked to pickup a workpiece from a location, can select the proper gripper for the task. The timing of workpiece handling can also be pre-programmed, thus the grip arm knows the proper gripper at a certain time. For example, certain I/O stations are dedicated to certain types of reticles. When the reticle is removed from a certain I/O station, this information can be communicated to the robot arm so that the robot arm can select the proper gripper mechanism.

The controller can also employ a try-out methodology, where each gripper is tested in turn, and the proper gripper can be selected when the two designs (workpiece's design and gripper's design) matched. The designs for different workpiece holders and grippers are preferably distinct to facilitate the mating effort.

What is claimed is:

1. An integrated handler for picking and placing at least an object comprising two opposite straight sides, the integrated handler comprising
   a first gripper handler;
   a second gripper handler,
      wherein the second gripper handler is operable to approach the object from one direction for handling the object,
      wherein the second gripper handler comprises two fork elements,
      wherein each fork element comprises a top section and a bottom section,
      wherein the top section and the bottom section are operable to support the object with the object disposed between the top section and the bottom section,
      wherein the two fork elements are configured to be disposed at two extreme edges of the object along the two opposite straight sides of the object.

2. A handler as in claim 1
   wherein the top section and the bottom section are configured to be not extended outside the object.

3. A handler as in claim 1
   wherein the top section is longer than the bottom section.

4. A handler as in claim 1
   wherein the top section is shorter than the bottom section.

5. A handler as in claim 1 wherein the object comprises a wafer, a reticle, or a carrier box.

6. A handler as in claim 1 wherein the first and the second gripper handlers are further configured for gripping a carrier box.

7. An integrated handler for picking and placing at least an object, comprising
   an edge gripper handler,
      wherein the edge gripper handler comprises two movable arms,
      wherein the movable arms are operable to approach the object from two directions for gripping the object,
      wherein each movable arm comprises a gripper element,
      wherein the gripper element comprises a top component and a bottom component,
      wherein the top component and the bottom component are operable to support the object with the object disposed between the top component and the bottom component;
   a fork gripper handler,
      wherein the fork gripper handler is operable to approach the object from one direction for gripping the object,
      wherein the fork gripper handler comprises two fork elements, wherein each fork element comprises a top section and a bottom section,
wherein the top section and the bottom section are operable to handle the object with the object disposed between the top section and the bottom section.

8. A handler as in claim 7 further comprising
a robot arm, wherein the edge gripper handler and the fork gripper handler are coupled to the robot arm.

9. A handler as in claim 8
wherein the edge gripper handler and the fork gripper handler are fixedly coupled to the robot arm,
wherein the fork gripper handler is fixedly coupled to the robot arm at an angle away from the edge gripper handler.

10. A handler as in claim 7
wherein the edge gripper handler comprises a movement mechanism for moving the two movable arms.

11. A handler as in claim 7
wherein the two fork elements are configured to be disposed at two extreme edges of the object.

12. A handler as in claim 7
wherein the top section is longer than the bottom section, or
wherein the top section is shorter than the bottom section.

13. A system comprising
a first station, wherein the first station is operable to support a first type of objects;
a second station, wherein the second station is operable to support a second type of objects,
   wherein the first type of objects is configured to be handled by an arm approaching the objects from two directions,
   wherein the second type of objects is configured to be handled by an arm approaching the objects from one direction;
a robot arm,
   wherein the robot arm comprises an edge gripper handler and a fork gripper handler,
   wherein the edge gripper handler comprises two movable arms,
   wherein the movable arms are operable to approach an object from two directions for gripping the object,
   wherein each movable arm comprises a gripper element,
   wherein the gripper element comprises a top component and a bottom component,
   wherein the top component and the bottom component are operable to support the object with the object disposed between the top component and the bottom component,
   wherein the fork gripper handler is operable to approach an object from one direction for gripping the object,
   wherein the fork gripper handler comprises two fork elements,
   wherein each fork element comprises a top section and a bottom section,
   wherein the top section and the bottom section are operable to handle the object with the object disposed between the top section and the bottom section.

14. A system as in claim 13
wherein the edge gripper handler and the fork gripper handler are fixedly coupled to the robot arm,
wherein the fork gripper handler is fixedly coupled to the robot arm at an angle away from the edge gripper handler.

15. A system as in claim 13
wherein the robot arm comprises a mechanism to position the edge gripper handler or the fork gripper handler to face an object.

16. A system as in claim 13
wherein the two fork elements are configured to be disposed at two extreme edges of the object.

17. A system as in claim 13
wherein the top section is longer than the bottom section, or
wherein the top section is shorter than the bottom section.

18. A system as in claim 13 further comprising
a chamber for storing, processing or using the objects.

* * * * *